United States Patent [19]

Peteuil

[11] Patent Number: 4,689,492
[45] Date of Patent: Aug. 25, 1987

[54] SWITCHING CIRCUIT

[76] Inventor: Donald D. Peteuil, 521 Hahaione St., #4G, Honolulu, Hi. 96825

[21] Appl. No.: 891,969

[22] Filed: Aug. 1, 1986

[51] Int. Cl.⁴ ............... H01H 36/00; H03K 17/72; H05B 37/02
[52] U.S. Cl. ................... 307/142; 307/116; 307/126; 307/630; 361/181; 315/208; 315/362; 340/562
[58] Field of Search ............ 307/142, 141, 141.4, 307/140, 132 R, 125, 116, 242, 243, 247 A, 252 R, 252 J, 253, 592, 595, 597, 605, 601–603, 126, 143; 323/904, 905; 361/179, 181, 195, 196; 340/562, 565; 315/362, 208

[56] References Cited

U.S. PATENT DOCUMENTS

| | | |
|---|---|---|
| 3,666,988 | 5/1972 | Bellis ................... 307/116 X |
| 3,965,465 | 6/1976 | Alexander ............. 307/125 X |
| 4,352,141 | 9/1982 | Kent ..................... 307/116 X |
| 4,538,074 | 8/1985 | Fraden .................. 307/141 X |

Primary Examiner—William M. Shoop, Jr.
Assistant Examiner—Sharon D. Logan
Attorney, Agent, or Firm—Keith D. Beecher

[57] ABSTRACT

A switching circuit for turning on and off an electronic instrument, an electric lamp, or other electrically powered electric or electronic circuits, by means of a single switch, and which is constructed so that when the switch is closed momentarily and opened, the switching circuit remains "on" until the switch is again momentarily operated. However, when the switch is closed for a longer time interval, the switching circuit remains "on" for so long as the switch is closed and turns "off" when the switch is opened.

4 Claims, 1 Drawing Figure

SWITCHING CIRCUIT

BACKGROUND OF THE INVENTION

Various types of electrical switching circuits are disclosed in the prior art which are controlled by a single push button spring-biased switch which releases when pressure is removed from the switch. For example, U.S. Pat. No. 4,538,074 describes a switching circuit which includes a first transistor for providing power of an electronic instrument, and a second transistor connected to the first transistor for controlling the first transistor. A push button switch is provided which serves to turn the circuit on or off as the switch is successively momentarily pressed and released. U.S. Pat. No. 4,112,764 discloses an automatic switching circuit which is responsive to the momentary operation of a push button switch to turn "on", and which remains "on" for a predetermined time interval after the switch has been pressed and released.

The switching circuit of the present invention is also capable of turning its controlled instrumentality "on" or "off" by means of a single spring-biased push button switch. However, the switching circuit of the invention has an additional feature in that it has a dual function to provide a latched control of the instrumentality when the switch is pressed momentarily and released; or to turn "on" the instrumentality only so long as the switch is operated when the switch is pressed for a longer interval.

Specifically, the switching circuit of the invention in the embodiment to be described includes a manually operated push button spring-biased switch which, when momentarily closed and released, causes the switching circuit to turn "on" and to remain "on" until the push button switch is again momentarily operated; and the switching circuit of the invention has an additional feature in that when the push button switch is pressed for a longer time interval, the switching circuit will remain "on" only so long as the switch is pressed, and will turn "off" when the switch is released.

A feature of the switching circuit of the invention is that it may be incorporated into a single integrated circuit chip.

DETAILED DESCRIPTION OF THE ILLUSTRATED EMBODIMENT

Figure 1:
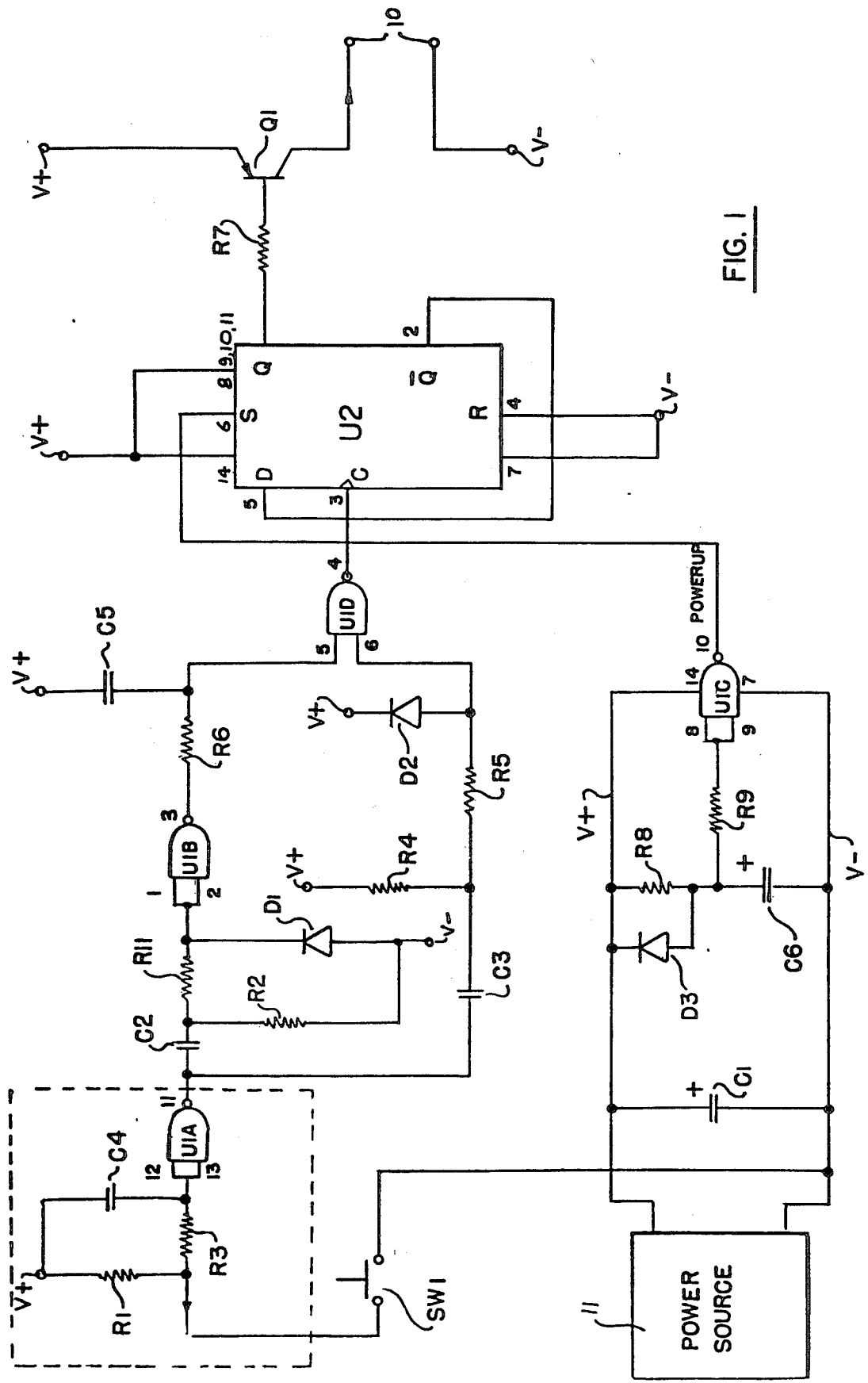
FIG. 1 is a circuit diagram of a switching circuit representing one embodiment of the invention.

The switching circuit of FIG. 1 includes a CMOS integrated circuit chip which is represented by separate elements U1A, U1B, U1C and U1D. The elements U1A, U1B and U1C are connected as inverters, and element U1D is connected as a "nand" gate.

The circuit also includes a D-type flip-flop U2 which may be of the type designated 4013. The Q output of flip-flop U2 is connected through a 10 kilo-ohm resistor R7 to the base of a PNP transistor Q1. The emitter of transistor Q1 is connected to the positive terminal V+, and the collector of the transistor is connected to one of the output terminals 10. The other output terminal 10 is connected to the negative terminal V−.

Transistor Q1 may be of the type designated MPS-A64. This particular type of transistor is preferable to assure that excess current will not be drawn from the flip-flop U2 when the transistor is conductive. Whenever flip-flop U2 is in its set state, transistor Q1 is non-conductive, and the switching circuit is "open". However, when the flip-flop is toggled to its reset state, transistor Q1 is rendered conductive, and the switching circuit is then turned "on".

A power source 11 provides a direct current voltage across its output terminals V+ and V−. These terminals are connected to a 1 microfarad capacitor C1, and to a series combination of a 1 megohm resistor R8 and a 1 microfarad capacitor C6. A diode D3 is connected across resistor R8, and it may be of the type designated 1N4148. Resistor R8 and capacitor C6 form a 1 second resistance.capacitance time delay network. The junction of resistor R8 and capacitor C6 is connected through a 27 kilo-ohm resistor R9 to pins 8 and 9 of inverter U1C. Output pin 10 of the inverter is connected to the set terminal S of flip-flop U2, pin 6.

The circuit described in the preceding paragraph functions as a "power up" circuit, and it assures that the switching circuit will be "open" when power is first applied. The power up circuit supplies a signal to the set terminal "S" of flip-flop U2 pin 6 to assure that the flip-flop will be forced to its set state when power is first turned on, so that transistor Q1 will be non-conductive and the switching circuit will be "open". As capacitor C6 charges in 1 second, the output of inverter U1 is reduced to zero. However, flip-flop U2 remains set, and the switching circuit remains "open" until the flip-flop is toggled to its reset state by operation of a spring-biased push button switch SW1.

Push button switch SW1 is connected to the negative terminal V−, and through a 2.2 kilo-ohm resistor R1 to V+. One side of resistor R3 is connected to one side of the switch SW1, and its other side is connected to a 0.1 microfarad capacitor C4 which is connected to the positive terminal V+ and to pins 12 and 13 of inverter U1A. Resistor R3 and capacitor C4 function as a 10 millisecond time delay network. Resistor R1 controls the current flow through switch SW1 when the switch is closed, and it provides for sufficient current flow through the switch to assure good contact.

The circuit described in the preceding paragraph operates as a debounce circuit, so that switches which have contacts that bounce may be used. This debounce circuit assures that a clean output will be produced at pin 11 of inverter U1A each time the push button switch SW1 is pressed closed.

The output pin 11 of inverter U1A is coupled through a 0.22 microfarad capacitor C2 and through a 10 kilo-ohm resistor R11 to pins 1 and 2 of inverter U1B. The junction of capacitor C2 and resistor R11 is connected to a 1 megohm resistor R2, and the other side of resistor R11 is connected to a diode D1 which, likewise, may be of the type designated 1N4148. The resistor R2 and diode D1 are both connected to the negative terminal V−. Capacitor C2 and resistor R2 form a 125 millisecond time delay network. Resistor R11 is a current limiting resistor which protects the CMOS chip. The diode D1 assures that when the push button switch SW1 is released, pins 1 and 2 of inverter U1B will be clipped at a maximum of 0.5 volts below the V− level, likewise for the protection of the CMOS chip.

The output pin 3 of inverter U1B is connected through a 100 kilo-ohm resistor R6 to pin 5 of "nand" gate U1D. Resistor R6 is also connected to a 0.22 microfarad capacitor C5 which, in turn, is connected to the positive terminal V+. Capacitor C5 and resistor R6 form a 22 millisecond time delay network. The circuit described above applies a delayed relatively broad pulse to pin 5 of the "nand" gate each time switch SW1 is closed.

The output pin 11 of inverter U1 is also coupled through a 0.1 microfarad capacitor C3 and through a 10 kilo-ohm resistor R5 to pin 6 of "nand" gate U1D. The junction of capacitor C3 and resistor R5 is connected through a 200 kilo-ohm resistor R4 to terminal V+. Pin 6 of "nand" gate U1D is also connected through a diode D2 to the positive terminal V+. Diode D2 may be of the type designated 1N4148. This diode serves to protect the CMOS chip. When the push button switch SW1 is first closed, the voltage at pin 6 is clippsed so that it will not exceed 0.5 volts above V+. Resistors R5 and R11 limit the instantaneous current to pin 6 and pins 1, 2 respectively, likewise for protection purposes.

The circuit described in the preceding paragraph applies a relatively narrow pulse to pin 6 of "nand" gate U1D each time switch SW1 is released.

Accordingly, when push button switch SW1 is closed, a relatively broad pulse is applied to pin 5 of "nand" gate U1D, resulting in a positive-going output pulse at pin 4 of the "nand" gate. The leading edge of this positive-going pulse triggers the flip-flop U2 to its reset state. Transistor Q1 now becomes conductive, and the switching circuit is "closed".

Should push button switch SW1 now be instantaneously released, the resulting narrow pulse applied to pin 6 of "nand" gate U1D will occur at the same time as the relatively broad pulse applied to pin 5, and the pulse applied to pin 6 will not be passed to the output of the "nand" gate. Accordingly, the flip-flop U2 will remain in its reset state after the switch SW1 has been released, and it will remain "on" until the switch SW1 is again momentarily operated to toggle the flipflop U2 to its set state thereby causing the switching circuit to turn "off".

However, if the push button switch SW1 is held closed for a longer length of time, and then released, the relatively narrow pulse applied to pin 6 of "nand" gate U1D will occur after the termination of the relatively broad pulse applied to pin 5, and the relatively narrow pulse will be passed by the gate to produce a positive-going pulse at output pin 4. The leading edge of the positive-going pulse appearing at output pin 4 will toggle the flip-flop back to its set state, causing the switching circuit to be turned "off". Accordingly, under the latter conditions, the switching circuit will remain "on" for so long as the switch SW1 is closed, and it will turn "off" when the switch is released.

The invention provides, therefore, a simple switching circuit which has a dual function, and which responds to the operation of a single push button switch, either to be turned "on" in a latched condition when the switch is momentarily closed and released, and to remain "on" until the switch is again momentarily operated; or to be turned "on" and remain "on" so long as the switch is closed, when the switch is operated for a longer time interval, and to be turned "off" when the switch is released.

It will be appreciated that while a particular embodiment of the invention has been shown and described, modifications may be made. It is intended in the claims to cover all modifications which come within the spirit and scope of the invention.

I claim:

1. A switching circuit including a bi-stable element having first and second stable states; an output circuit connected to said bi-stable element to be turned "on" and "off" as said bi-stable element is triggered between its two stable states; a control switch; logic circuitry connecting the control switch to said bi-stable element to apply a first trigger signal to said bi-stable element when the control switch is closed to trigger the bi-stable element from one to the other of its stable states, and to apply a second trigger signal to said bi-stable element when the switch is opened to trigger said bi-stable element from one to the other of its stable states; said logic circuitry including gate means to block the application of said second trigger signal to said bi-stable element when said control switch is opened within a predetermined interval after its closure, and said logic circuitry further including a first circuit for applying a first pulse to said gate means when said control switch is closed, and a second circuit for applying a second pulse to said gate means when said control switch is opened, said first circuit including time delay network means for delaying the application of said first pulse to said gate means with respect to said control switch closure.

2. The switching circuit defined in claim 1, and which includes circuitry connecting a power source to said bi-stable element for setting said bi-stable element in one of its stable states when power is first applied to the circuit thereby causing said output circuit to be turned "off".

3. The switching circuit defined in claim 1, and which includes a debounce circuit interposed between said control switch and said first and second circuits to apply a control pulse to said first and second circuits each time said control switch is operated, with said control pulse being free of noise signals which would cause spurious operation of the switching circuit.

4. The switching circuit defined in claim 1, in which said bi-stable element comprises a flip-flop, and in which said output circuit includes a transistor connected to an output terminal of said flip-flop.

* * * * *